United States Patent
Kobayashi et al.

(10) Patent No.: US 10,753,741 B2
(45) Date of Patent: Aug. 25, 2020

(54) OFFSET CALCULATION DEVICE AND AZIMUTH SENSOR THEREWITH

(71) Applicant: Rohm Co., Ltd., Kyoto (JP)

(72) Inventors: Tadashi Kobayashi, Kyoto (JP); Masafumi Seike, Kyoto (JP); Hideki Nishiyama, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 466 days.

(21) Appl. No.: 15/542,975

(22) PCT Filed: Dec. 2, 2015

(86) PCT No.: PCT/JP2015/083907
§ 371 (c)(1),
(2) Date: Jul. 12, 2017

(87) PCT Pub. No.: WO2016/114027
PCT Pub. Date: Jul. 21, 2016

(65) Prior Publication Data
US 2018/0003500 A1 Jan. 4, 2018

(30) Foreign Application Priority Data

Jan. 16, 2015 (JP) .................. 2015-006770

(51) Int. Cl.
*G01C 17/32* (2006.01)
*G01R 33/02* (2006.01)
(Continued)

(52) U.S. Cl.
CPC ............. *G01C 17/32* (2013.01); *G01C 17/38* (2013.01); *G01R 33/02* (2013.01);
(Continued)

(58) Field of Classification Search
CPC .... G01C 17/38; G01C 17/32; G01R 33/0206; G01R 33/02; G01R 33/09; G01R 33/07
See application file for complete search history.

(56) References Cited

U.S. PATENT DOCUMENTS

| 5,117,375 A | 5/1992 | Worcester et al. |
| 2005/0256673 A1 | 11/2005 | Hikida et al. |

(Continued)

FOREIGN PATENT DOCUMENTS

| CN | 1666086 A | 9/2005 |
| CN | 102353917 A | 2/2012 |

(Continued)

OTHER PUBLICATIONS

European Patent Office; Supplementary European Search Report mailed in corresponding European Patent Application No. 15877978.5 (dated Oct. 18, 2018).

(Continued)

*Primary Examiner* — Yoshihisa Ishizuka
(74) *Attorney, Agent, or Firm* — Fish & Richardson P.C.

(57) ABSTRACT

For triaxial magnetic detection data sequentially acquired as data points in a triaxial coordinate system, an offset calculation unit 30 calculates virtual data points P1'-P6' by evenly parallel-translating each of data points P1-P7 so that a reference data point P7, for example, arbitrarily chosen from the data points P1-P7 coincides with an origin point O. A virtual offset point C' for which the sum of the distances between the virtual data points P1'-P6' and a curved surface H1 passing through the origin point O is minimized is then calculated. An offset value C for the magnetic detection data is then calculated by parallel-translating the virtual offset point C' so as to restore the parallel-translated portion.

12 Claims, 10 Drawing Sheets (51) Int. Cl.
*G01C 17/38* (2006.01)
*G01R 33/07* (2006.01)
*G01R 33/09* (2006.01)

(52) U.S. Cl.
CPC .......... *G01R 33/0206* (2013.01); *G01R 33/07* (2013.01); *G01R 33/09* (2013.01)

(56) References Cited

U.S. PATENT DOCUMENTS

| | | | |
|---|---|---|---|
| 2006/0032064 A1* | 2/2006 | Sato | G01C 17/38 33/356 |
| 2007/0198209 A1 | 8/2007 | Sato | |
| 2007/0276625 A1 | 11/2007 | Hikida et al. | |
| 2009/0293295 A1 | 12/2009 | Hirobe et al. | |
| 2010/0161272 A1 | 6/2010 | Yamashita et al. | |
| 2011/0301897 A1 | 12/2011 | Weiss et al. | |
| 2012/0245877 A1* | 9/2012 | Handa | G01C 17/38 702/95 |

FOREIGN PATENT DOCUMENTS

| | | |
|---|---|---|
| EP | 0214817 A2 | 3/1987 |
| EP | 2157405 A1 | 2/2010 |
| JP | 2008-128649 | 6/2008 |
| JP | 4391416 B | 10/2009 |
| JP | 2011-185866 | 9/2011 |
| WO | 2005/061990 | 7/2005 |

OTHER PUBLICATIONS

Japanese Patent Office, International Search Report for PCT/JP2015/083907, dated Mar. 8, 2016, with English translation.

* cited by examiner

● : DATA POINTS (6 POINTS) CORRESPONDING TO MAXIMUM AND MINIMUM VALUES FOR 3 AXES
○ : DATA POINTS OTHER THAN ABOVE 6 POINTS

OFFSET CALCULATION DEVICE AND AZIMUTH SENSOR THEREWITH

TECHNICAL FIELD

The present invention relates to an offset calculation device, and to an azimuth sensor employing it.

BACKGROUND ART

An azimuth sensor (geomagnetism sensor) detects the direction of geomagnetism and thereby measures an azimuth. Here, the geomagnetism as the target of measurement is extremely feeble. Accordingly, for accurate detection of the azimuth, it is necessary to detect the true geomagnetism by canceling offsets ascribable to magnetic fields present in the environment (one produced inside the set that incorporates the azimuth sensor, one produced by a strong magnet or the like placed near the azimuth sensor, and the like) and offsets ascribable to the performance of the azimuth sensor itself.

Offsets for an azimuth sensor constantly vary both temporally and spatially. Accordingly, for accurate detection of an azimuth, it is necessary to keep canceling the offsets for the azimuth sensor continuously and at high speed.

Offsets can be corrected either manually by the user doing it consciously or automatically without the user being conscious of it. For better user-friendliness and enhanced detection accuracy of the azimuth sensor, automatic correction is preferred.

One example of conventional technology related to what is discussed above is seen in Patent Document 1 identified below.

LIST OF CITATIONS

Patent Literature

Patent Document 1: Japanese Patent registered as No. 4391416

SUMMARY OF THE INVENTION

Technical Problem

Inconveniently, with the conventional technology disclosed in Patent Document 1, offset correction processing requires a large amount of computation; to keep canceling offsets continuously and at high speed, high computing power is essential.

In view of the above-mentioned problems encountered by the present inventors, an object of the present invention is to provide an offset calculation device that can calculate offsets with a smaller amount of computation than ever and an azimuth sensor that employs such an offset calculation device.

Means for Solving the Problem

According to one aspect of what is disclosed herein, an offset calculation device for processing three-axis or two-axis magnetism detection data sequentially acquired as data points in a three-axis or two-axis coordinate system is configured to translate N data points (where N≥2) evenly such that one reference data point arbitrarily selected from the N data points coincides with the origin to derive (N−1) virtual data points except for the reference data point, then calculate a virtual offset point that minimizes the sum of the distances from a curved surface or curved line passing through the origin to the virtual data points respectively, and then calculate offset values for the magnetism detection data by translating the virtual offset point inversely the previous translation (a first configuration).

The offset calculation device according to the first configuration described above may be configured such that, when the virtual data points are represented by ($Hxi'$, $Hyi'$, $Hzi'$) (where i=1 to N−1), and the virtual offset point is represented by ($Hx0'$, $Hy0'$, $Hz0'$), it calculates the virtual offset point such as to minimize the equation of the curved surface given by formula (1) below (a second configuration).

[Equation 1]

$$H1 = \Sigma_i(Hxi'^2 + Hyi'^2 + Hzi'^2 - 2Hxi' \cdot Hx0' - 2Hyi' \cdot Hy0' - 2Hzi' \cdot Hz0')^2 \quad (1)$$

Instead, the offset calculation device according to the first configuration described above may be configured such that, when the virtual data points are represented by ($Hxi'$, $Hyi'$) (where i=1 to N−1), and the virtual offset point is represented by ($Hx0'$, $Hy0'$), it calculates the virtual offset point such as to minimize the equation of the curved line given by formula (2) below (a third configuration).

[Equation 2]

$$H2 = \Sigma_i(Hxi'^2 + Hyi'^2 - 2Hxi' \cdot Hx0' - 2Hyi' \cdot Hy0')^2 \quad (2)$$

The offset calculation device according to any one of the first to third configurations may be configured to constantly search, by referring to offset-corrected magnetism detection data, for a plurality of maximum and minimum data points corresponding to the maximum and minimum values for the respective axes and, when all the differences between the maximum and minimum values for the respective axes are equal to or larger than respective threshold values, execute a sequence of offset calculation processing (a fourth configuration).

In the offset calculation device according to the fourth configuration above, the N data points may include the plurality of maximum and minimum data points (a fifth configuration).

In the offset calculation device according to the fifth configuration above, the reference data point may be an arbitrary point different from any of the plurality of maximum and minimum data points (a sixth configuration).

In the offset calculation device according to the fifth configuration above, the reference data point may be one of the plurality of maximum and minimum data points (a seventh configuration).

According to another aspect of what is disclosed herein, an azimuth sensor includes: a magnetism detection device configured to generate three-axis or two-axis magnetism detection data; an offset calculation device according to any one of the first to seventh configurations described above configured to calculate an offset for the magnetism detection data; an offset correction device configured to correct the offset for the magnetism detection data; and an azimuth calculation device configured to generate azimuth data from corrected magnetism detection data (an eighth configuration).

According to yet another aspect of what is disclosed herein, an electronic appliance includes the azimuth sensor according to the eighth configuration (a ninth configuration).

According to still another aspect of what is disclosed herein, an offset calculation method for processing three-axis or two-axis magnetism detection data sequentially acquired as data points in a three-axis or two-axis coordinate system includes: translating N data points (where N≥2) evenly such that one reference data point arbitrarily selected from the N data points coincides with the origin to derive (N−1) virtual data points except for the reference data point; calculating a virtual offset point that minimizes the sum of the distances from a curved surface or curved line passing through the origin to the virtual data points respectively; and calculating offset values for the magnetism detection data by translating the virtual offset point inversely to the previous translation (a tenth configuration).

Advantageous Effects of the Invention

According to the invention disclosed herein, it is possible to provide an offset calculation device that can calculate offsets with a smaller amount of computation than ever and an azimuth sensor that employs such an offset calculation device.

DESCRIPTION OF EMBODIMENTS

Figure 1:
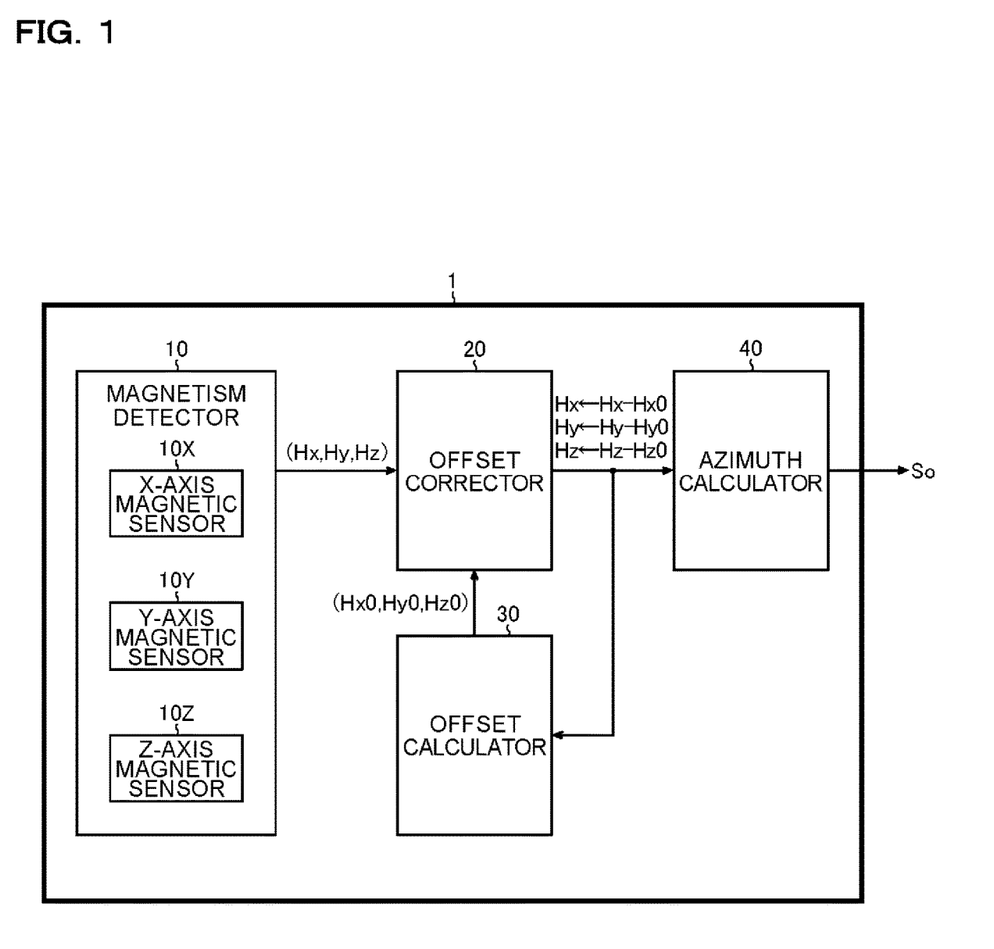
FIG. 1 is a block diagram showing an overall configuration of an azimuth sensor 1.

FIG. 1 is a block diagram showing an overall configuration of an azimuth sensor 1. The azimuth sensor 1 of this configuration example includes a magnetism detector 10, an offset corrector 20, an offset calculator 30, and an azimuth calculator 40.

The magnetism detector 10 includes a magnetic sensor 10X which detects magnetism in the X-axis direction, a magnetic sensor 10Y which detects magnetism in the Y-axis direction, and a magnetic sensor 10Z which detects magnetism in the Z-axis direction, and generates three-axis magnetism detection data (Hx, Hy, Hz). The magnetic sensors 10X, 10Y, and 10Z each comprise a magnetism detection element, which is, for example, a Hall-effect device or an MR (magnetoresistance) device. The X-, Y-, and Z-axes are designed to be perpendicular to each other.

The offset corrector 20 corrects the magnetism detection data (Hx, Hy, Hz) by using offset values calculated by the offset calculator 30 (which are offset components (Hx0, Hy0, Hz0) contained in three-axis magnetism detection data (Hx, Hy, Hz) respectively). The offset correction processing yields Hx=Hx−Hx0, Hy=Hy−Hy0, and Hy=Hz−Hz0.

The offset calculator 30 constantly monitors the offset-corrected magnetism detection data (Hx, Hy, Hz), and sequentially updates the offset values (Hx0, Hy0, Hz0) for the magnetism detector 10. The offset calculation processing (offset updating processing) will be described in detail later.

The azimuth calculator 40 generates azimuth data So from the offset-corrected magnetism detection data (Hx, Hy, Hz).

In FIG. 1, the offset corrector 20, the offset calculator 30, and the azimuth calculator 40 are shown as mutually independent processing blocks; instead, these processing blocks may be implemented in an integrated fashion by use of a CPU (central processing unit), a DSP (digital signal processor), or the like.

Offset Calculation Processing (First Example)

Figure 2:
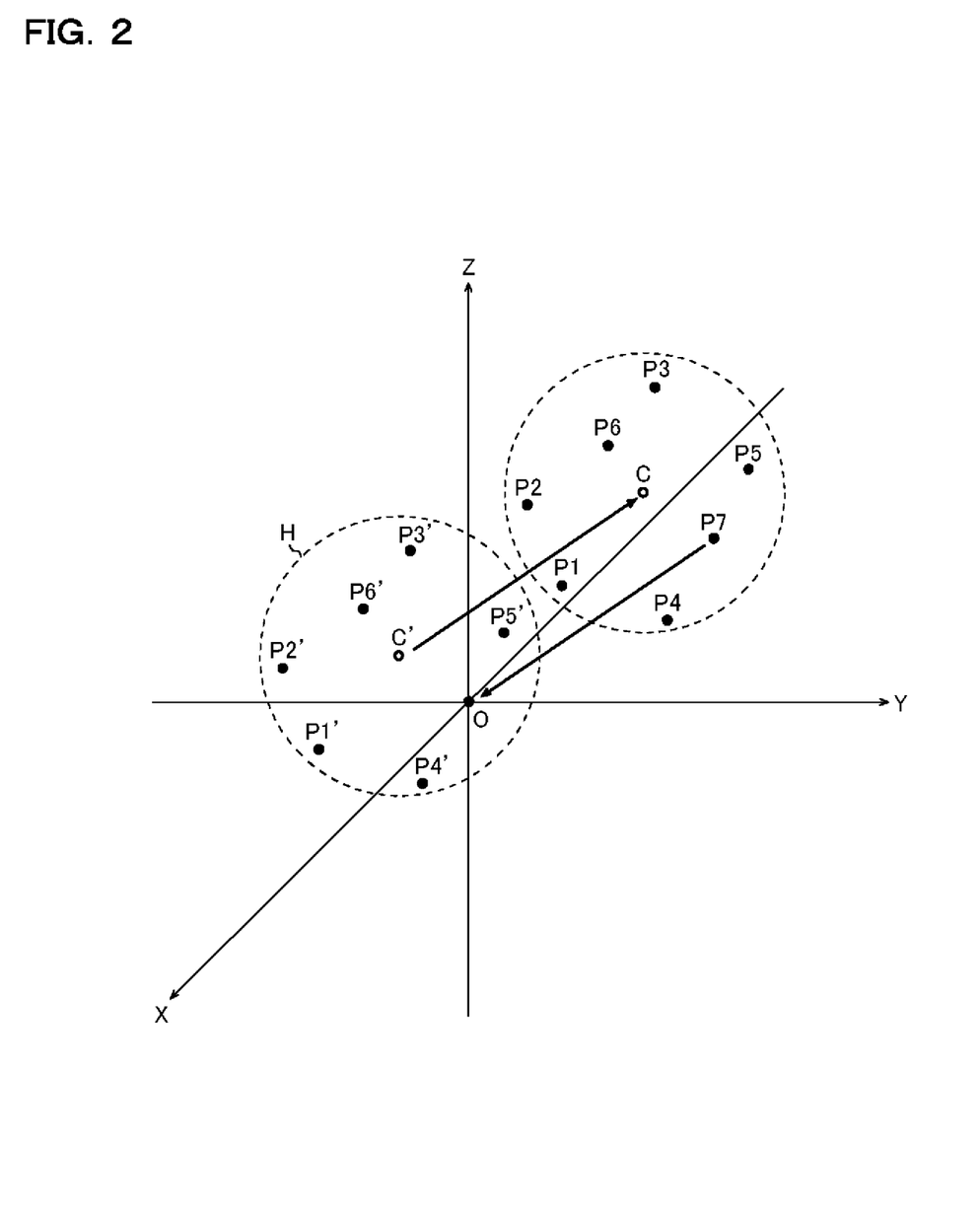
FIG. 2 is an XYZ coordinate space diagram showing a first example of offset calculation processing.

FIG. 2 is an XYZ coordinate space diagram showing a first example of the offset calculation processing in the offset calculator 30. In the offset calculation processing of the first example, with respect to three-axis magnetism detection data (Hx, Hy, Hz) successively acquired as three-axis coordinate data points, N data points (where N≥2; in the illustrated example, a total of 7 data points P1 to P7 (N=7)) are referred to. In a case where the magnetism detector 10 has high precision, sufficient offset calculation accuracy is achieved without unnecessary increasing the number of data points.

Next, the data points P1 to P7 are translated evenly such that one reference data point arbitrarily selected from the data points P1 to P7 coincides with the origin O (0, 0, 0). In the illustrated example, the data point P7 is selected as the reference data point. Through the translation, except for the reference data point P7, six (=N−1) virtual data points P1' to P6' are derived.

Next, a virtual offset point C' that minimizes the sum of the distances from a curved surface H1 passing through the origin O to the virtual data points P1' to P6' respectively is calculated. Specifically, when the virtual data points Pi' are represented by (Hxi', Hyi', Hzi') (in the illustrated example, i=1 to 6), and the virtual offset point C' is represented by (Hx0', Hy0', Hz0'), then a virtual offset point C' that minimizes the equation of the curved surface H1 given by formula (1) below is calculated.

[Equation 3]

$$H1 = \Sigma_i (Hxi'^2 + Hyi'^2 + Hzi'^2 - 2Hxi' \cdot Hx0' - 2Hyi' \cdot Hy0' - 2Hzi' \cdot Hz0')^2 \quad (1)$$

Note that the equation of the curved surface H1 given by formula (1) above is derived on the assumption that a spherical surface with a radius r centered at the virtual offset point C' passes through the origin O (r=|OC'|).

Lastly, the virtual offset point C' is translated inversely to the previous translation, and thereby the proper offset point C (Hx0, Hy0, Hz0) (corresponding to the offset values for the magnetism detector 10) is calculated.

As described above, the offset calculation processing of this example adopts the following calculation method: a curved surface is assumed that necessarily passes an arbitrary one of N data points that are referred to; thereby the equation of the curved surface simpler than the equation of a spherical surface is derived; then the parameters of the derived equation are estimated from the remaining (N−1) data points.

This, unlike the conventional technique that directly applies the equation of a spherical surface to calculate offset values, requires no complicated calculation (such as average value calculation), and thus makes it possible to reduce the amount of computation required for the offset correction processing and cancel offsets continuously and at high speed.

Although the detailed description given above deals with an example where three-axis magnetism detection data (Hx, Hy, Hz) is the target of offset correction, the offset calculation method described above can be applied also to a case where two-axis magnetism detection data (Hx, Hy) is the target of offset correction.

In that case, a virtual offset point C' that minimizes the sum of the distances from a curved line H2 passing through the origin O (0, 0) to the virtual data points Pi' respectively can be calculated. Specifically, when the virtual data points Pi' are represented by (Hxi', Hyi'), and the virtual offset point C' is represented by (Hx0', Hy0'), then a virtual offset point C' that minimizes the equation of the curved line H2 given by formula (2) below is calculated.

[Equation 4]

$$H2 = \Sigma_i (Hxi'^2 + Hyi'^2 - 2Hxi' \cdot Hx0' - 2Hyi' \cdot Hy0')^2 \quad (2)$$

Offset Calculation Processing (Second Example)

Figure 3:
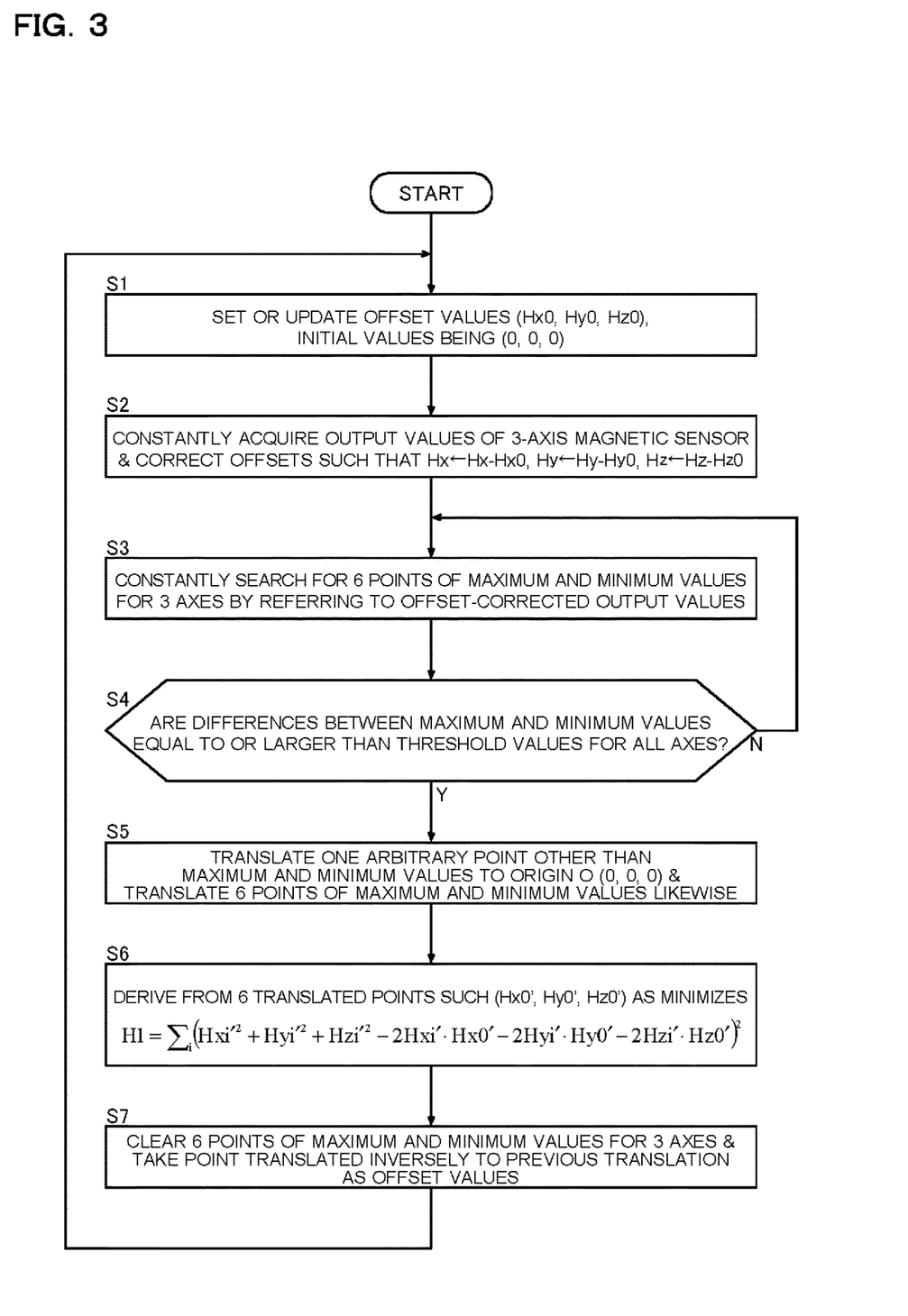
FIG. 3 is a flow chart showing a second example of offset calculation processing.

FIG. 3 is a flow chart showing a second example of the offset calculation processing in the offset calculator 30. In the offset calculation processing of the second example, before the execution of the offset calculation processing (corresponding to steps S5 to S7 in FIG. 3) of the first example, preprocessing (corresponding to steps S1 to S4 in FIG. 3) for determining a data point group that is appropriate as the target of reference is introduced. A detailed step-by-step description will follow. It is assumed that, unless otherwise stated, the agent of the steps is the offset calculator 30.

First, at step S1, offset values (Hx0, Hy0, Hz0) are set or updated. The initial values are (0, 0, 0).

Next, at step S2, three-axis magnetism detection data (Hx, Hy, and Hz) are constantly acquired, and are subjected to offset correction (Hx=Hx−Hx0, Hy=Hy−Hy0, and Hy=Hz−Hz0). The agent of step S2 is the offset corrector 20.

Next, at step S3, with reference to the offset-corrected magnetism detection data (Hx, Hy, and Hz), a total of six data points of the maximum and minimum values for the three axes are constantly searched for.

Figure 4:
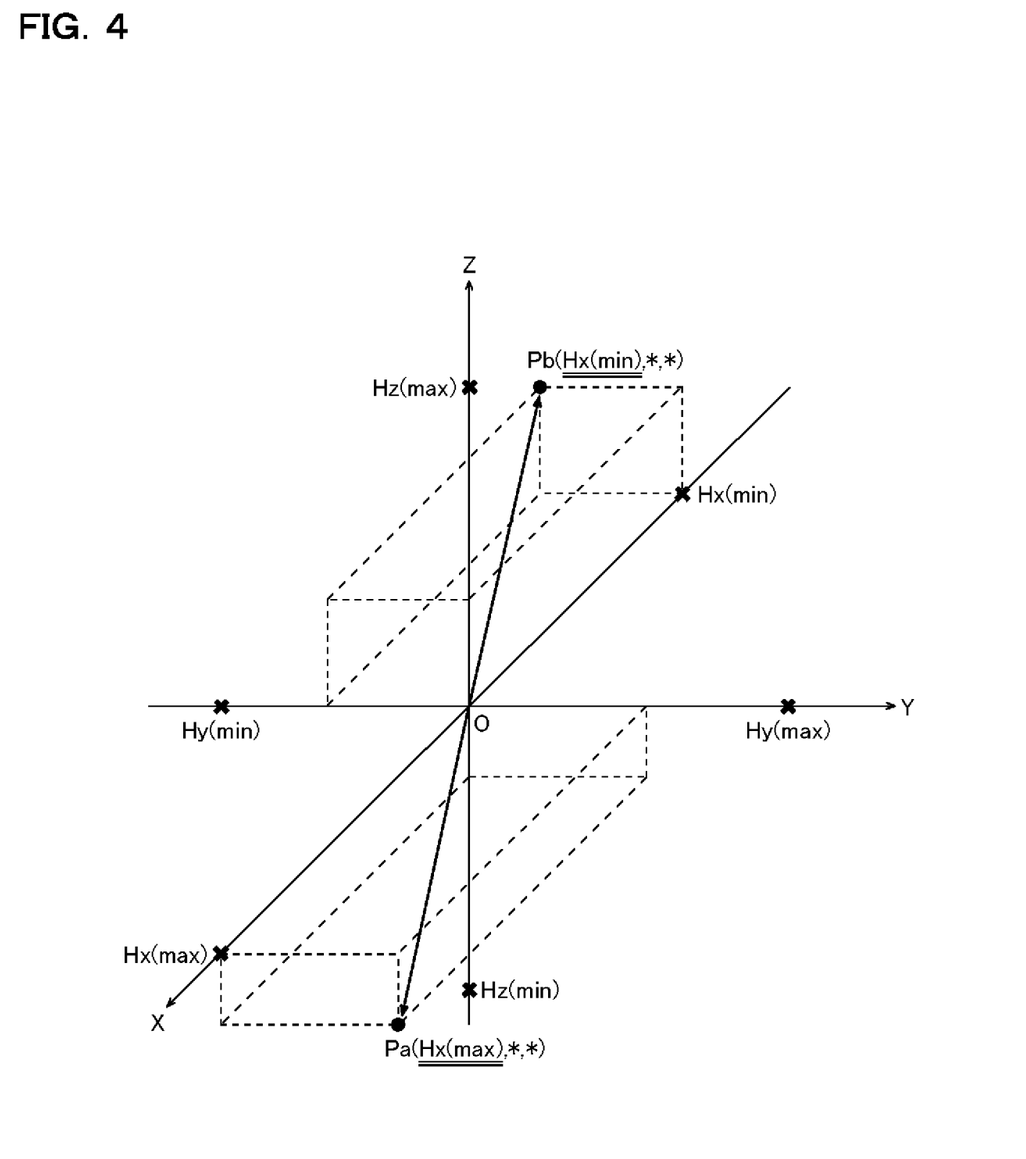
FIG. 4 is an XYZ coordinate space diagram showing maximum and minimum values for three axes.

FIG. 4 is an XYZ coordinate space diagram showing the maximum and minimum values for the three axes. In the illustrated example, the maximum value of the X-axis component is Hx(max), and the corresponding X-axis maximum data point is Pa(Hx(max), *, *). On the other hand, the minimum value of the X-axis component is Hx(min), and the corresponding X-axis minimum data point is Pb(Hx(min), *, *).

Although not specifically shown in FIG. 3, also for the maximum and minimum values Hy(max) and Hy(min) of the Y-axis component and the maximum and minimum values of the Z-axis component Hz(max) and Hz(min), the maximum and minimum data points for the respective axes, like those mentioned above, exist.

With reference back to FIG. 3, the description of the flow will continue. At step S4, whether or not the difference values ΔHx, ΔHy, ΔHz between the maximum and minimum values for the respective axes are equal to or larger than threshold values is checked. For example, if ΔHx≥THx, ΔHy≥THy, and ΔHz≥THz, the check result is "yes", and if any of those inequalities is not fulfilled, the check result is "no". At step S4, if the check result is "yes", the flow proceeds to step S5 and, if the check result is "no", the flow returns to S3.

In view of the magnitude of geomagnetism as the target of measurement (20 to 80 µT in general, 40 to 50 µT in Japan), it is preferable to set the threshold values THx to THz for the respective axes at, for example, about 30 µT. The threshold values THx to THz for the respective axes may be equal, or may be different from each other.

If the check result of step S4 is "no", the flow repeats the loop of steps S3 and S4. That is, until the difference values ΔHx, ΔHy, ΔHz for the respective axes are equal to or larger than the threshold value, the maximum and minimum values for the three axes continue being searched for.

Figure 5:
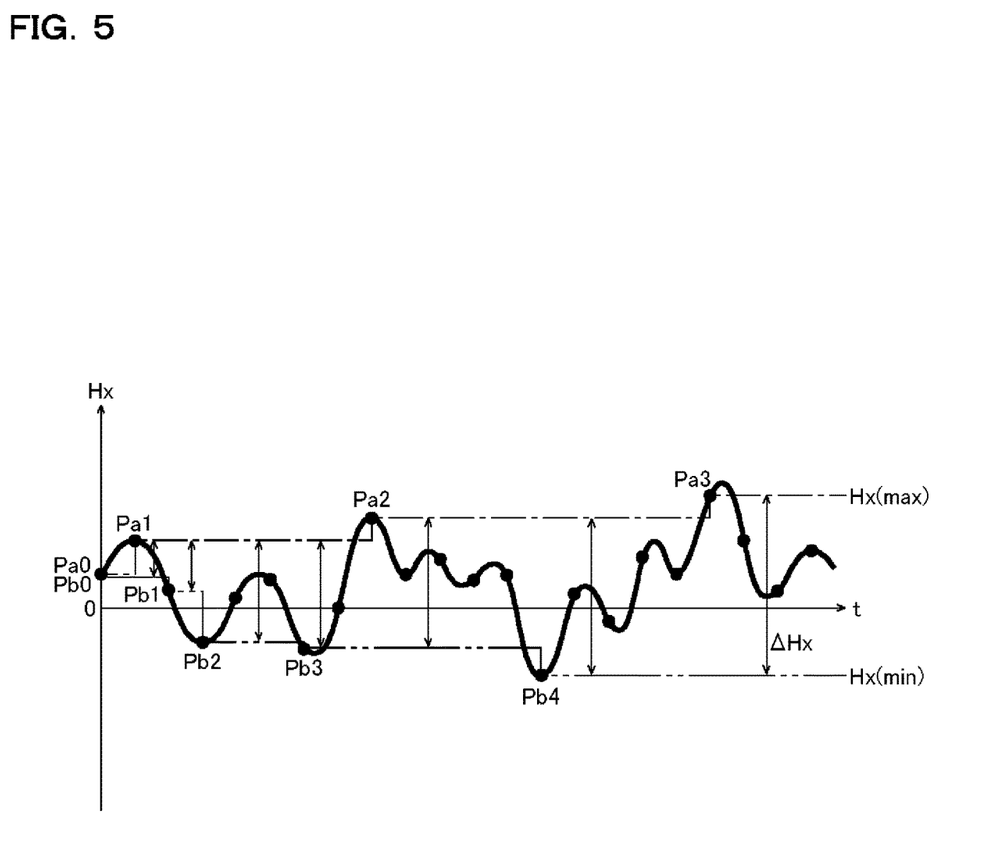
FIG. 5 is a timing chart showing variation behavior of a difference value ΔHx.

FIG. 5 is a time chart showing the variation behavior of the difference value ΔHx for the X axis. Tracking the data points indicated by the symbols Pa0 to Pa3 and Pb0 to Pb4 reveals how the X-axis maximum and minimum data points Pa and Pb go being updated successively as time passes. Naturally, the difference value ΔHx for the X axis becomes larger each time at least one of the maximum and minimum values Hx(max) and Hx(min) of the X-axis component is updated.

With reference back to FIG. 3, the description of the flow will continue. If the check result of step S4 is "yes", the offset calculation processing (corresponding to steps S5 to S7 in FIG. 3) of the first example described previously is executed. That is, in the offset calculator 30, when the differences between the maximum and minimum values for the respective axes are all equal to or larger than the threshold values, it is recognized that a data point group that is appropriate as the target of reference in offset calculation (a group of data points that are considered to be comparatively evenly distributed in the XYZ coordinate space centered at the offset point C) has been collected, and the offset calculation processing described previously is executed.

Adopting this algorithm helps prevent the risk of acquiring an inappropriate offset calculation result from an unevenly distributed data point group, and thus helps enhance the reliability of offset calculation processing.

At step S5, as one step of the offset calculation processing described previously, the maximum and minimum data points for the respective axes are translated such that one arbitrary point different from any of the maximum and minimum data points for the respective axes is translated to the origin O (0, 0, 0).

That is, all the data points that are subjected to actual calculation in the offset calculation processing of the second example are six points comprising the maximum and minimum data points for the respective axes and one point different from any of them (corresponding to the reference data point mentioned previously). Accordingly, the offset calculator 30 has only to be provided with a total of seven registers, and thus, compared with the conventional configuration, which requires 10 or more data points, it is possible to greatly reduce the circuit scale or the software code size.

Figure 6:
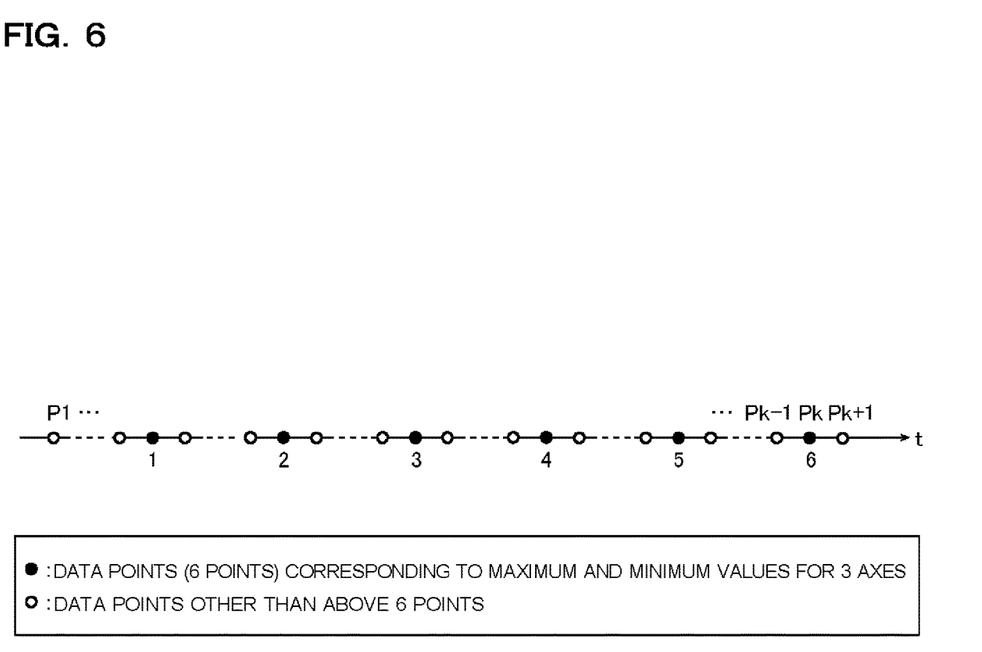
FIG. 6 is a timing chart showing an example of selection of a reference data point that is translated to an origin.

FIG. 6 is a timing chart showing an example of the selection of a reference data point that is translated to the origin (0, 0, 0). In the diagram, solid circles represent the maximum and minimum data points (a total of six points) corresponding to the maximum and minimum values for the three axes. On the other hand, hollow circles represent data points other than those six points.

For example, as shown in FIG. 6, when, as a result of a continuous search for the maximum and minimum values for the three axes from the data point P1 to the data point Pk, all the maximum and minimum data points for the respective axes are determined, from the viewpoint of adopting the simplest algorithm for reference data point selection, it is preferable to select the data point Pk+1 acquired immediately after the data point Pk. This, however, is not meant to exclude selecting any one of data points P1 to Pk−1 (excluding the maximum and minimum data points) as the reference data point.

With reference back to FIG. 3, the description of the flow will continue. At step S6, from the six points that have undergone translation at step S5, a virtual offset point C' (Hx0', Hy0', Hz0') that minimizes the equation of the curved surface H1 given by formula (1) noted previously is derived. This has been described in detail previously, and therefore no overlapping description will be repeated.

Next, at step S7, the six points of the maximum and minimum values for the three axes are cleared, and the offset point C (Hx0, Hy0, Hz0) translated inversely to the previous translation is calculated as the offset values for the magnetism detector 10.

Thereafter, the flow returns to step S1, so that the above-described sequence of processing is repeated. As a result, the offsets for the azimuth sensor 1 which constantly change both temporally and spatially keep being canceled continuously and at high speed, and it is thus possible to detect the azimuth accurately.

Although the above description deals with an example where, at step S5, one arbitrary point different from any of the maximum and minimum data points for the respective axes is selected as a reference data point that is translated to the origin O (0, 0, 0), the reference data point may instead be one of the maximum and minimum data points for the respective axes. This configuration helps reduce by one the number of data points that are subjected to actual calculation in offset calculation processing, and thus helps further reduce the circuit scale or the software code size. However, depending on how the maximum and minimum data points for the respective axes are distributed, adopting this configuration may lead to lower offset calculation accuracy.

Figure 7:
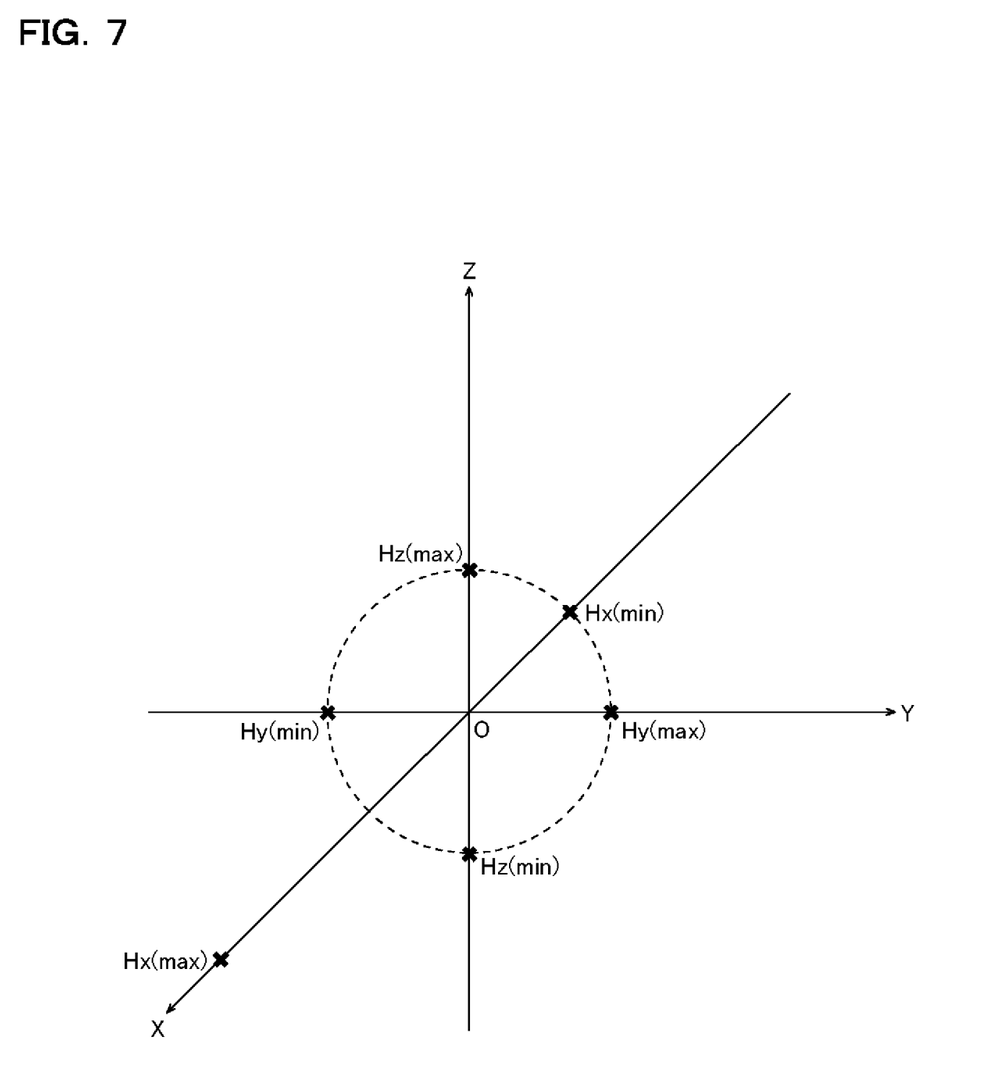
FIG. 7 is an XYZ coordinate space diagram illustrating a point to be noted when a data point corresponding to one of maximum and minimum values for three axes is selected as a reference data point.

FIG. 7 is an XYZ coordinate space diagram illustrating a point to be noted when a data point corresponding to one of the maximum and minimum values for the three axes is selected as a reference data point. It can occur that, under the influence of an extraneous magnetic field or the like, one of the maximum and minimum values for the respective axes (in the illustrated example, the maximum value Hx(max) of the X-axis component deviates greatly from the others).

If a maximum or minimum data point that deviates greatly from the others is selected as a reference data point, the amount of translation required to make the reference data point coincide with the origin deviates greatly from the proper value. This makes it impossible to obtain correct offset values C through the offset calculation processing described previously.

To avoid this inconvenience, it is preferable, for example, to take measures such as excluding, of the six data points corresponding to the maximum and minimum values for the three axes, those of which the respective axis components have the largest and smallest absolute values from candidates for the reference data point.

<Application to Electronic Appliances>

Figure 8:
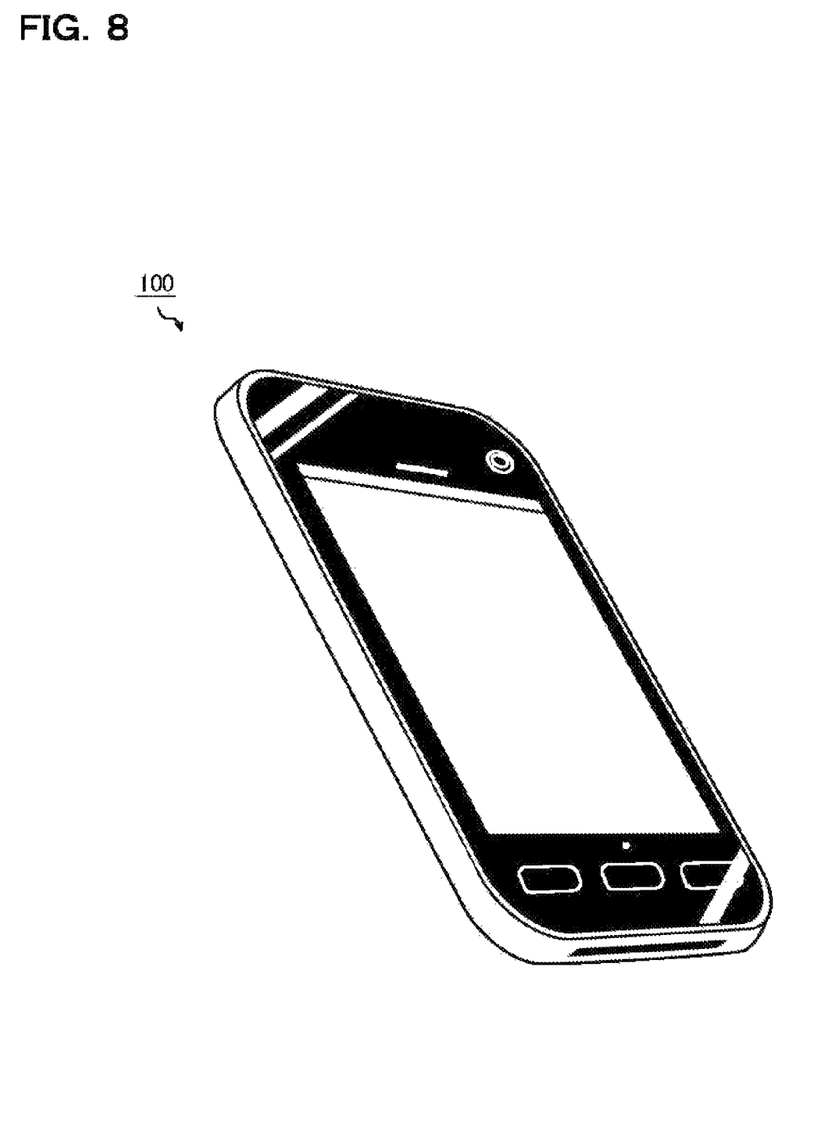
FIG. 8 is an exterior view of a smartphone.
Figure 9:
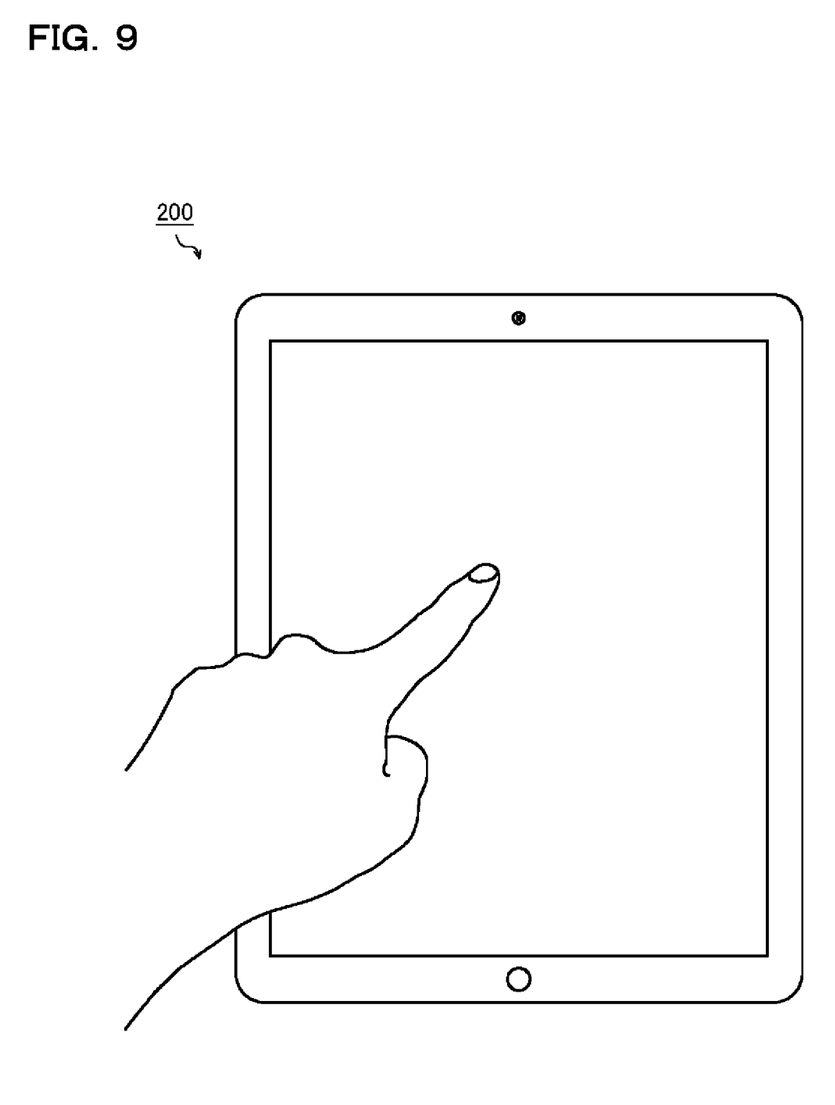
FIG. 9 is an exterior view of a tablet terminal.
Figure 10:
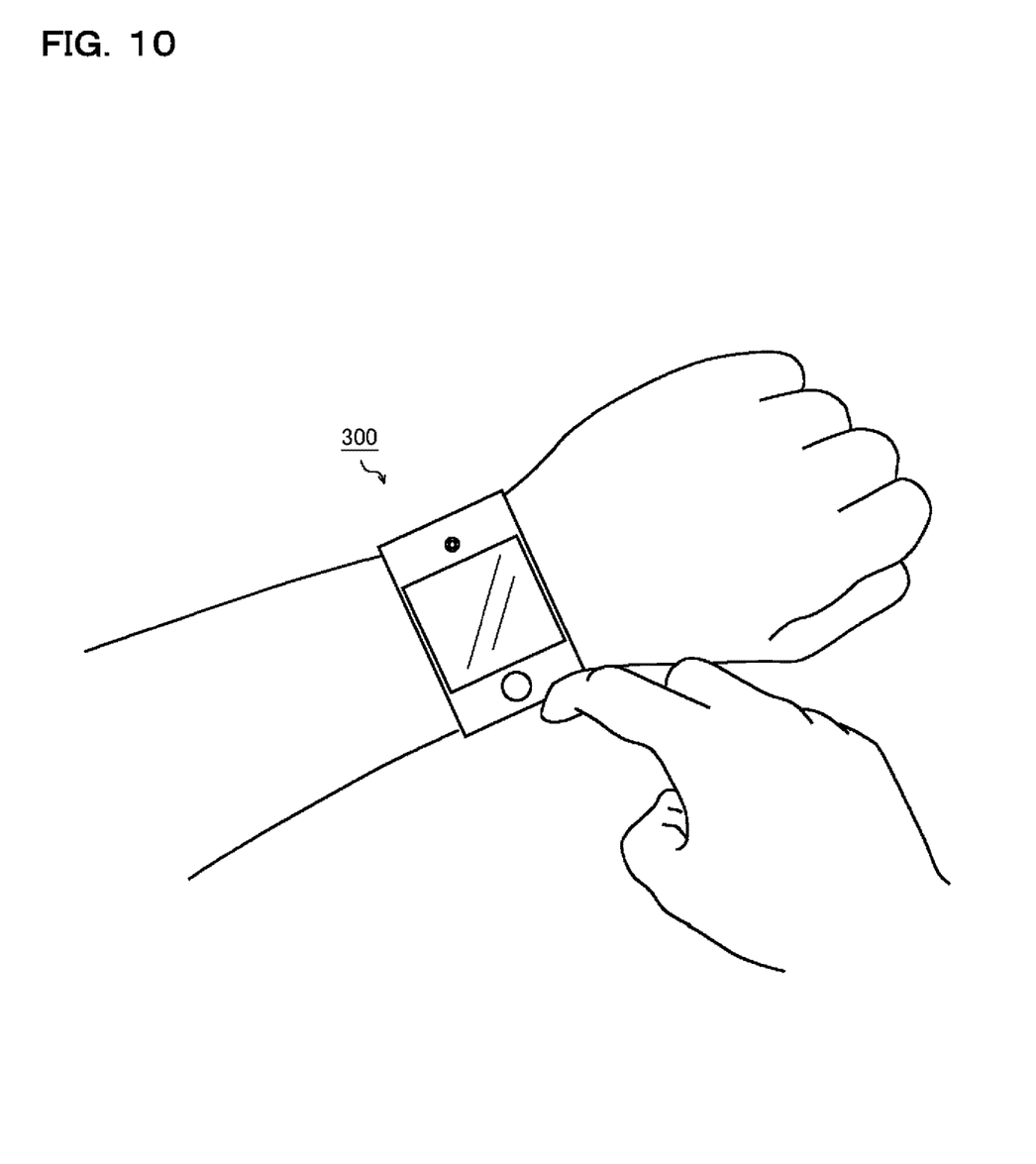
FIG. 10 is an exterior view of a smartwatch.

FIGS. 8 to 10 are exterior views of examples of electronic appliances (a smartphone 100, a tablet terminal 200, and a smartwatch 300 respectively) incorporating the azimuth sensor 1. Incorporating the azimuth sensor 1 described previously as an electronic compass in a variety of appliances makes it possible to accurately detect the direction in which the user points. In particular, using the electronic compass in combination with a GPS (global positioning system) helps enhance the accuracy of position detection in map and navigation applications.

<Other Modifications>

The various technical features disclosed herein may be implemented in any other manner than specifically described by way of embodiments above, and allows for many modifications within the scope of the technical ingenuity of the invention. That is, the embodiments described above should be considered to be in every aspect illustrative and not restrictive, and the technical scope of the present invention should be understood to be defined not by the description of embodiments given above but by the appended claims and to encompasses any modifications in the sense and scope equivalent to those of the claims.

INDUSTRIAL APPLICABILITY

The invention disclosed herein finds applications in azimuth sensors incorporated in, for example, smartphones, tablet terminals, smartwatches, and the like.

LIST OF REFERENCE SIGNS 1 azimuth sensor
10 magnetism detector
10X, 10Y, 10Z magnetic sensor (X-axis, Y-axis, Z-axis)
20 offset corrector
30 offset calculator
40 azimuth calculator
100 smartphone
200 tablet terminal
300 smartwatch

The invention claimed is:

1. An azimuth sensor comprising:
a magnetism detection device configured to generate three-axis or two-axis magnetism detection data;
an offset calculation device configured to calculate an offset for the magnetism detection data;
an offset correction device configured to correct the offset for the magnetism detection data; and
an azimuth calculation device configured to generate azimuth data from corrected magnetism detection data,
wherein the offset calculation device is configured to perform, as offset calculation processing for processing the three-axis or two-axis magnetism detection data sequentially acquired as data points in a three-axis or two-axis coordinate system, the following operations sequentially:
translate N data points (where N≥2) evenly such that one reference data point arbitrarily selected from the N data points coincides with an origin and translating also (N−1) data points other than the reference data point by a same amount of translation as the reference data point, thereby to derive (N−1) virtual data points except for the reference data point,
calculate a virtual offset point that minimizes a sum of distances from a curved surface passing through the origin to the (N−1) virtual data points respectively, and
calculate offset values for the magnetism detection data by translating the virtual offset point inversely to a previous translation,
wherein for the (N−1) virtual data points are represented by (Hxi', Hyi', Hzi') (where i=1 to N−1), and the virtual offset point represented by (Hx0', Hy0', Hz0'), the offset calculation device is configured to calculate the virtual offset point such as to minimize a function H1, where $$H1=\Sigma_i(Hxi'^2+Hyi'^2+Hzi'^2-2Hxi'\cdot Hx0'-2Hyi'\cdot Hy0'-2Hzi'\cdot Hz0')^2.$$

2. The azimuth sensor of claim 1, wherein the offset calculation device is configured to:
constantly search, by referring to offset-corrected magnetism detection data, for a plurality of maximum and minimum data points corresponding to maximum and minimum values for respective axes and,
when all differences between the maximum and minimum values for respective axes are equal to or larger than respective threshold values, execute a sequence of offset calculation processing again to update the offset-corrected magnetism detection data.

3. The azimuth sensor of claim 2, wherein the N data points include the plurality of maximum and minimum data points.

4. The azimuth sensor of claim 3, wherein the reference data point is an arbitrary point different from any of the plurality of maximum and minimum data points.

5. The azimuth sensor of claim 3, wherein the reference data point is one of the plurality of maximum and minimum data points.

6. An electronic appliance, comprising the azimuth sensor of claim 1 as an electronic compass for detecting a direction in which a user faces.

7. An azimuth sensor comprising:
a magnetism detection device configured to generate three-axis or two-axis magnetism detection data;
an offset calculation device configured to calculate an offset for the magnetism detection data;
an offset correction device configured to correct the offset for the magnetism detection data; and
an azimuth calculation device configured to generate azimuth data from corrected magnetism detection data,
wherein the offset calculation device is configured to perform, as offset calculation processing for processing the three-axis or two-axis magnetism detection data sequentially acquired as data points in a three-axis or two-axis coordinate system, the following operations sequentially:
translate N data points (where N≥2) evenly such that one reference data point arbitrarily selected from the N data points coincides with an origin and translating also (N−1) data points other than the reference data point by a same amount of translation as the reference data point, thereby to derive (N−1) virtual data points except for the reference data point,
calculate a virtual offset point that minimizes a sum of distances from a curved line passing through the origin to the (N−1) virtual data points respectively, and
calculate offset values for the magnetism detection data by translating the virtual offset point inversely to a previous translation,
wherein for the (N−1) virtual data points represented by (Hxi', Hyi') (where i=1 to N−1), and the virtual offset point represented by (Hx0', Hy0'), the offset calculation device is configured to calculate the virtual offset point such as to minimize a function H2, where $$H2=\Sigma_i(Hxi'^2+Hyi'^2-2Hxi'\cdot Hx0'-2Hyi'\cdot Hy0')^2.$$

8. The azimuth sensor of claim 7, wherein the offset calculation device is configured to:
constantly search, by referring to offset-corrected magnetism detection data, for a plurality of maximum and minimum data points corresponding to maximum and minimum values for respective axes and,
when all differences between the maximum and minimum values for respective axes are equal to or larger than respective threshold values, execute a sequence of offset calculation processing again to update the offset-corrected magnetism detection data.

9. The azimuth sensor of claim 8, wherein the N data points include the plurality of maximum and minimum data points.

10. The azimuth sensor of claim 9, wherein the reference data point is an arbitrary point different from any of the plurality of maximum and minimum data points.

11. The azimuth sensor of claim 9, wherein the reference data point is one of the plurality of maximum and minimum data points.

12. An electronic appliance, comprising the azimuth sensor of claim 7 as an electronic compass for detecting a direction in which a user faces.

* * * * *